(12) United States Patent
Ahn et al.

(10) Patent No.: US 6,960,805 B2
(45) Date of Patent: Nov. 1, 2005

(54) FLASH MEMORY CELL AND METHOD OF MANUFACTURING THE SAME, AND PROGRAMMING/ERASING/READING METHOD IN THE FLASH MEMORY CELL

(75) Inventors: Byung Jin Ahn, Seoul (KR); Byung Soo Park, Ichon-shi (KR); Sung Jae Chung, Seoul (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/750,850

(22) Filed: Jan. 5, 2004

(65) Prior Publication Data

US 2004/0135195 A1 Jul. 15, 2004

Related U.S. Application Data

(62) Division of application No. 10/287,781, filed on Nov. 5, 2002, now Pat. No. 6,703,275.

(30) Foreign Application Priority Data

Dec. 29, 2001 (KR) ........................................ 2001-87976

(51) Int. Cl.⁷ ............................................ H01L 29/788
(52) U.S. Cl. ........................ 257/316; 257/314; 257/316; 257/347; 438/200; 438/257
(58) Field of Search ................................ 257/314, 315, 257/316, 347; 438/200, 257

(56) References Cited

U.S. PATENT DOCUMENTS

| | | | |
|---|---|---|---|
| 5,168,334 A | | 12/1992 | Mitchell et al. |
| 5,429,969 A | * | 7/1995 | Chang ........................ 438/267 |
| 5,889,302 A | * | 3/1999 | Liu ............................ 257/315 |
| 5,898,619 A | * | 4/1999 | Chang et al. .......... 365/185.23 |
| 5,998,829 A | | 12/1999 | Choi et al. |
| 6,044,022 A | | 3/2000 | Nachumovsky |
| 6,054,734 A | | 4/2000 | Aozasa et al. |
| 6,087,230 A | | 7/2000 | Kishi |
| 6,181,597 B1 | | 1/2001 | Nachumovsky |
| 6,191,445 B1 | * | 2/2001 | Fujiwara ..................... 257/321 |
| 6,269,023 B1 | | 7/2001 | Derhacobian et al. |
| 6,331,465 B1 | * | 12/2001 | Forbes et al. ............... 438/260 |
| 6,348,381 B1 | * | 2/2002 | Jong et al. .................. 438/261 |
| 6,433,384 B1 | * | 8/2002 | Hashimoto .................. 257/316 |
| 6,436,765 B1 | * | 8/2002 | Liou et al. .................. 438/259 |
| 6,461,906 B1 | * | 10/2002 | Lung ......................... 438/216 |
| 6,477,085 B1 | * | 11/2002 | Kuo ....................... 365/185.18 |
| 6,482,706 B1 | * | 11/2002 | Yeh et al. .................... 438/301 |
| 6,493,280 B2 | * | 12/2002 | Mihnea et al. ............. 365/218 |
| 6,500,710 B2 | * | 12/2002 | Nakagawa .................. 438/257 |
| 6,514,831 B1 | * | 2/2003 | Liu ............................ 438/303 |
| 6,566,682 B2 | * | 5/2003 | Forbes ........................ 257/51 |
| 6,573,169 B2 | * | 6/2003 | Noble et al. ................ 438/592 |
| 6,583,466 B2 | * | 6/2003 | Lin et al. ..................... 257/314 |
| 6,610,586 B1 | * | 8/2003 | Liu ............................ 438/526 |
| 6,627,555 B2 | * | 9/2003 | Eitan et al. ................. 438/710 |
| 6,627,945 B1 | * | 9/2003 | Tripsas et al. .............. 257/315 |

* cited by examiner

*Primary Examiner*—David Nelms
*Assistant Examiner*—Dao H. Nguyen
(74) *Attorney, Agent, or Firm*—Mayer, Brown, Rowe & Maw LLP

(57) ABSTRACT

The present invention relates to a flash memory cell and method of manufacturing the same, and programming/erasing/reading method in the flash memory cell. According to the present invention, a source region and a drain region are first formed and a tunnel oxide film is then formed. Therefore, it is possible to prevent damage of the tunnel oxide film due to an ion implantation process. Further, independent two channel regions are formed below the floating gate. Thus, it is possible to store data of two or more bits at a single cell. In addition, the tunnel oxide film, the floating gate and the dielectric film having an ONO structure are formed at a given regions. It is thus possible to reduce the steps of a process and improve an electrical characteristic and integration level of a device.

8 Claims, 11 Drawing Sheets

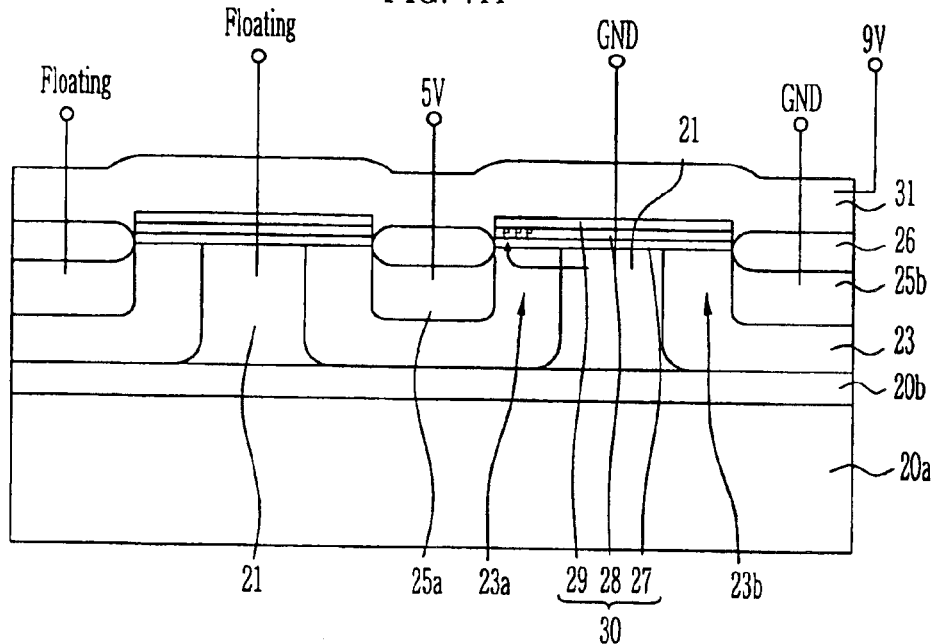
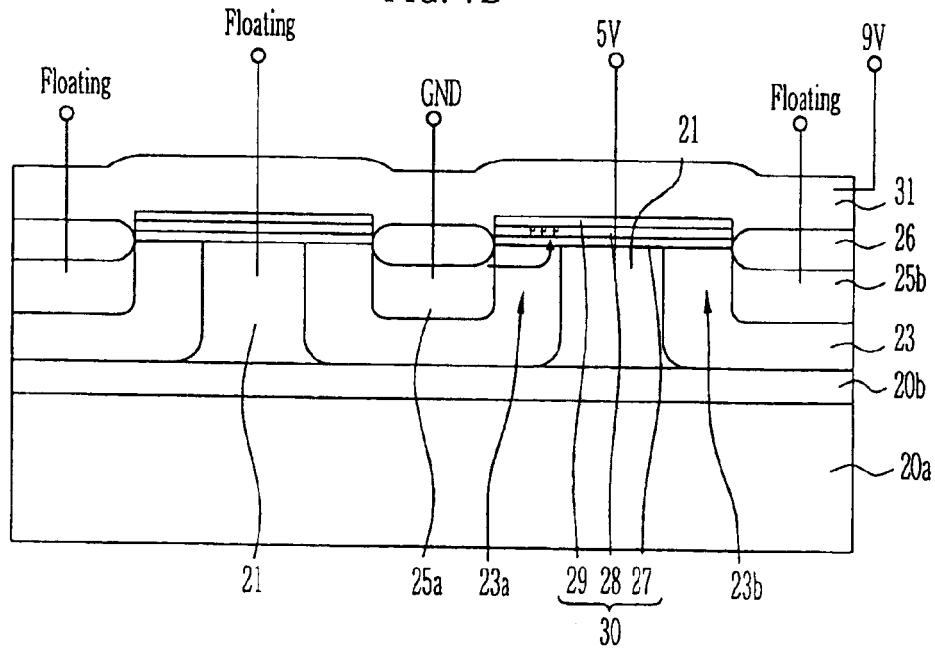

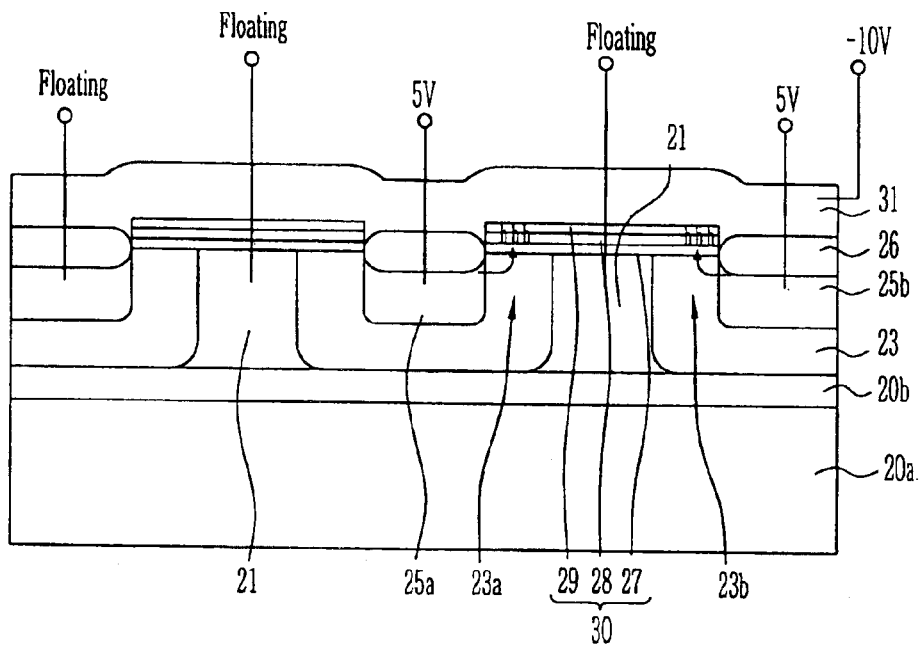
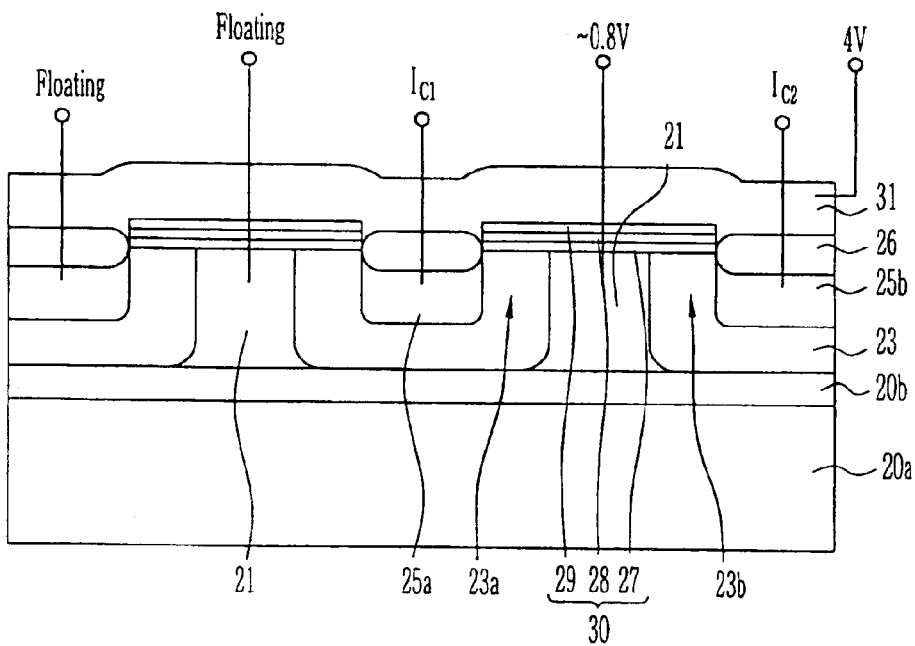

FLASH MEMORY CELL AND METHOD OF MANUFACTURING THE SAME, AND PROGRAMMING/ERASING/READING METHOD IN THE FLASH MEMORY CELL

This application is a division of Ser. No. 10/287,781 filed Nov. 5, 2002 and now U.S. Pat No. 6,703,275.

BACKGROUND OF THE INVENTION

1. Field of the Invention

The invention relates generally to a flash memory cell and method of manufacturing the same, and programming/erasing/reading method in the flash memory cell. More particularly, the invention relates to a flash memory cell having a silicon-oxide-nitride-oxide-silicon (SONOS) structure in which silicon, an oxide film, a nitride film, an oxide film and silicon are sequentially stacked, and method of manufacturing the same, and programming/erasing/reading method in the flash memory cell.

2. Description of the Prior Art

A flash memory cell is a non-volatile memory device that is electrically programmed and erased. A basic structure and programming/erasing operation of the flash memory cell will be described below.

FIG. 1 is a cross-sectional view of a conventional flash memory cell for describing the structure and programming/erasing operation of the flash memory cell.

As shown in FIG. 1, the flash memory cell includes a tunnel oxide film 12, a floating gate 13 consisting of a first polysilicon layer, an ONO dielectric film 14, a control gate 15 consisting of a second polysilicon layer, and source and drain 16a, 16b that are formed at both edges of the tunnel oxide film 12, all of which are sequentially stacked on a semiconductor substrate 11.

In the flash memory cell constructed above, if the control gate 15 is applied with a high voltage of about 9V and the drain 16b is applied with a voltage of about 5V having about 5 μs pulse, channel hot electrons generated on the surface of the semiconductor substrate 11 below the gate oxide film 12. The generated hot electrons are then stored at the floating gate 13 through the gate oxide film 12, so that a programming operation is performed.

Further, if the control gate 15 in the flash memory cell is applied with a negative voltage of about −9V and the semiconductor substrate 11 is applied with a high voltage of about 9V, the electrons stored at the floating gate 13 are discharged from the floating gate 13 based on a FN (Fwoler Nerdheim) tunneling effect, so that an erasing operation is performed.

The flash memory cell constructed above is formed by exposure/etching process several times. Therefore, there are problems that the process steps are complicated and obtaining a process margin is difficult. In addition, the conventional flash memory cell requires a large area compared to peripheral devices and only data of one bit per cell can be stored. Due to this, there is a problem that the efficiency is degraded in view of the level of integration.

Meanwhile, an edge portion of the tunnel oxide film is damaged by various etching and/or ion implantation processes for forming the control gate and the floating gate after a tunnel oxide film is thinly formed. Thus, there is a problem that the charge storage capacity of the floating gate is degraded. In this case, as a defective cell may occur in a worse case, there is a problem that reliability of the device and the process is degraded.

SUMMARY OF THE INVENTION

The present invention is contrived to solve the above problems and an object of the present invention is to provide a flash memory cell and method of manufacturing the same, and programming/erasing/reading method in the flash memory cell, by which damage of a tunnel oxide film due to an ion implantation process can be prevented by first forming a source region and a drain region and then forming a tunnel oxide film, data of two bits can be stored at a single cell by forming independent two channel regions below a floating gate, and an electrical characteristic and integration level of a device can be improved and the number of the process can be reduced by forming a tunnel oxide film, a floating gate and a dielectric film to be an ONO structure at a given region.

In order to accomplish the above object, a flash memory cell according to the present invention, is characterized in that it comprises a tunnel oxide film formed at a given region of a SOI substrate; a floating gate on the tunnel oxide film; a dielectric film on the floating gate; first and second channel regions at the SOI substrate below both ends of the floating gate; a source region formed between the first and second channel regions; first and second drain regions at the SOI substrate at both sides of the floating gate; and a word line formed on the dielectric film, wherein data of two bits or four bits are stored at a single cell by individually injecting electrons into the floating gate on the first and second channel regions or discharging the injected electrons, depending on voltages applied to the source region, the word line, and the first and second drain regions.

A method of manufacturing a flash memory cell according to a first embodiment of the present invention, is characterized in that it comprises the steps of forming a P type impurity region and a source region at a SOI substrate; forming a drain region consisting of a N type impurity region at the central region of the P type impurity region; forming a device isolation film on the drain region; forming a tunnel oxide film, a floating gate and a dielectric film having a stack structure on the source region and the P type impurity region, wherein the tunnel oxide film, the floating gate and the dielectric film being are separated by the device isolation film and both ends of the tunnel oxide film, the floating gate and the dielectric film are overlapped with a portion of the P type impurity region; and forming a conductive material layer and then forming a word line by means of an etching process using a word line mask.

A method of manufacturing a flash memory cell according to a second embodiment of the present invention, is characterized in that it comprises the steps of forming a P type impurity region and a source region at a SOI substrate; forming a drain region consisting of a N type impurity region at the central region of the P type impurity region; forming a device isolation film at the drain region, and a tunnel oxide film at the P type impurity region and the source region, by means of a thermal oxidization process; forming a floating gate and a dielectric film having a stack structure on the tunnel oxide film; and forming a conductive material layer and then forming a word line by means of an etching process using the word line as a mask.

In the above, the floating gate consists of a nitride film, and the tunnel oxide film, the floating gate and the dielectric film has an ONO structure.

After a flash memory cell is manufactured, an interlayer insulating film is formed on the entire structure and a contact plug is then formed to be connected with given regions of a source region and a drain region. At this time, the contact plug is formed one by one every 5 through 10 cells. The number of the contact plug is adjusted depending on a design rule or a voltage to be applied.

A method of programming a flash memory cell according to a first embodiment of the present invention, is characterized in that it, in a state that a word line is applied with a program voltage and a source region is connected to a ground terminal, a second drain region is connected to a ground terminal and a first drain region is applied with a voltage of about 5V, in case that elections are injected into one end of a floating gate consist of a nitride film; and the first drain region is connected to the ground terminal and the second drain region is applied with a voltage of about 5V, in case that the electrons are injected into the other end of the floating gate, whereby electrons are independently injected into one end and the other end of the floating gate to store data of two bits at a single cell.

A method of programming a flash memory cell according to a second embodiment of the present invention, is characterized in that it, in a state that the word line is applied with a program voltage and the source region is applied with a voltage of about 5V, the first drain region is connected to the ground terminal and the second drain region is floated, in case that the electrons are injected into one end of the floating gate consisting of a nitride film; and the second drain region is connected to the ground terminal and the second drain region is floated, in case that electrons are injected into the other end of the floating gate, whereby electrons are independently injected into one end and the other end of the floating gate to store data of two bits at a single cell.

A method of programming a flash memory cell according to a third embodiment of the present invention, is characterized in that one end of the floating gate is programmed with four states, by selectively performing: a first programming operation by which electrons are into a left side of one end of the floating gate by connecting the source region to the ground terminal and applying a voltage of about 5V to the first drain region, in a state that the word line is applied with a program voltage and the second drain region is connected to the ground terminal; and a second programming operation by which electrons are injected into a right side of one end of the floating gate by applying a voltage of about 5V to the source region and connecting the first drain region to the ground terminal, in a state that the word line is applied with a program voltage and the second drain region is floated, and the other end of the floating gate is programmed by the same method, whereby data of four bits are stored at a single flash memory cell.

In the above, the four states includes a first state that electrons are not injected into one end of the floating gate, a second state that electrons are injected only into a left side of one side of the floating gate, a third state that electrons are injected only into a right side of one side of the floating gate, and a fourth state that electrons are injected into the entire one end of the floating gate.

At this time, the program voltage is 9V through 10V and all the regions of other cells are floated in the process of injecting electrons into the floating gate.

A method of erasing a flash memory cell according to the present invention, is characterized in that: in a state that the word line is applied with an erase voltage and the source region is floated, a voltage of 5V is applied to the first and second drain regions to discharge electrons injected into one end and the other end of the floating gate consisting of a nitride film, thus performing an erase operation.

In the above, the aid erase voltage is −10V through −12V and all the regions of other cells are floated in the process of discharging electrons injected into the floating gate.

A method of reading a flash memory cell according to a first embodiment of the present invention, is characterized in that: in a state that the word line is applied with a read voltage and the source region is applied with a voltage of 0 through 0.8V, the first and second cell currents flowing into the first and second channel regions are sensed to determine a programming state of one end and the other end of the floating gate, thus reading data of two bits stored at the flash memory cell.

A method of reading a flash memory cell according to a second embodiment of the present invention, is characterized in that: the first drain region is connected to the ground terminal and the first cell current flowing into the source region is then sensed, in a state that the word line is applied with a read voltage and the source region is applied with a voltage of about 1V, and the source region is connected to the ground terminal and the second cell current flowing into the first drain region is then sensed, in a state that the word line is applied with a read voltage and the first drain region is applied with a voltage of about 1V, whereby data of two bits stored at one end of the floating gate are detected; and data of four bits stored at the flash memory cell are read by sensing the current flowing into the other end of the floating gate using the same method.

In the above, the data of the two bits are discriminated as '11' corresponding to a case that both the first and second currents are sensed to have a given value, '10' corresponding to a case that the first current is sensed to have a given value and the second current is sensed to have 0 A, '01' corresponding to a case that the first current is sensed to have 0 A and the second current is sensed to have a given value, and '00' corresponding to a case that both the first and second currents are sensed to have 0 A.

BRIEF DESCRIPTION OF THE DRAWINGS

The aforementioned aspects and other features of the present invention will be explained in the following description, taken in conjunction with the accompanying drawings, wherein:

FIG. 7A through FIG. 7D are cross-sectional views of the flash memory cells for describing a method of programming the flash memory cell shown in FIG. 3;

FIG. 8 is a cross-sectional view of the flash memory cell for describing a method of erasing the flash memory cell shown in FIG. 3;

FIG. 9 is a cross-sectional view of the flash memory cell for describing a method of reading data stored at the flash memory cell.

DETAILED DESCRIPTION OF PREFERRED EMBODIMENTS

Figure 1:
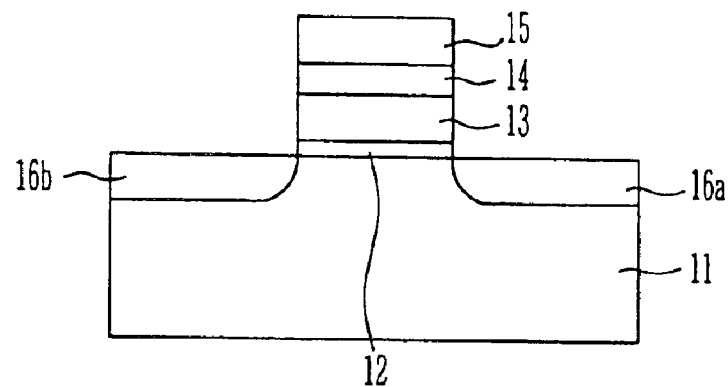
FIG. 1 is a cross-sectional view of a conventional flash memory cell for describing a structure and programming/erasing operation of the flash memory cell.

The present invention will be described in detail by way of a preferred embodiment with reference to accompanying drawings, in which like reference numerals are used to identify the same or similar parts.

Figure 2:
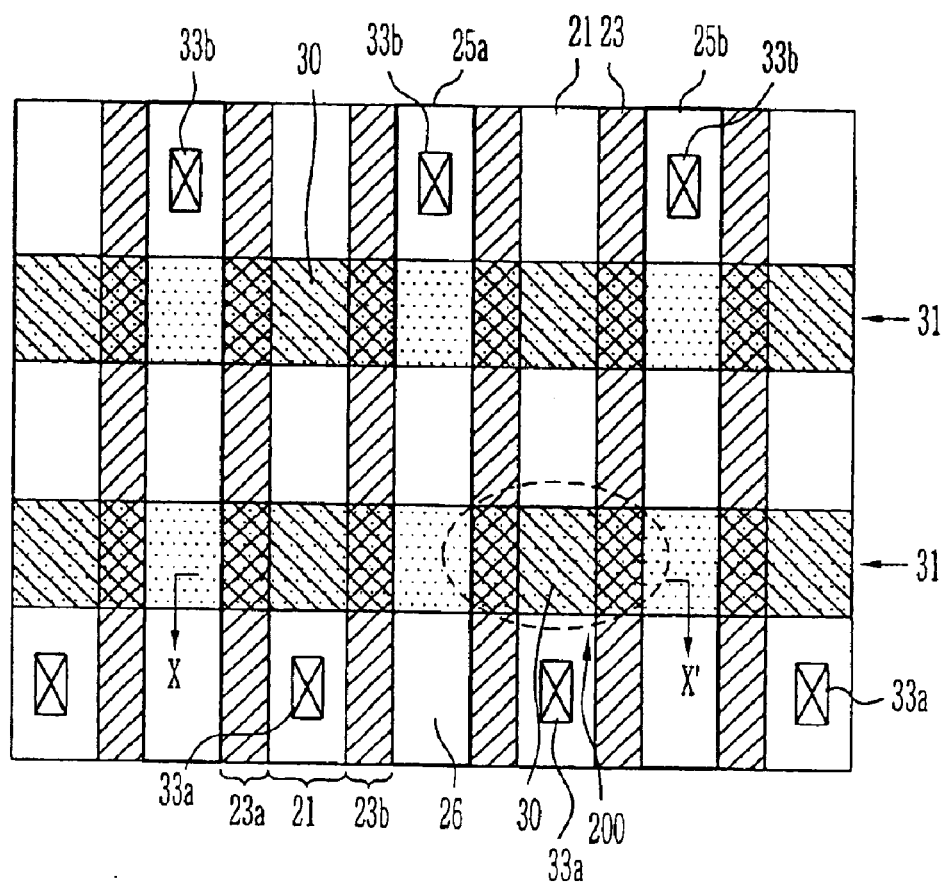
FIG. 2 is a layout diagram of a flash memory cell according to the present invention.
Figure 3:
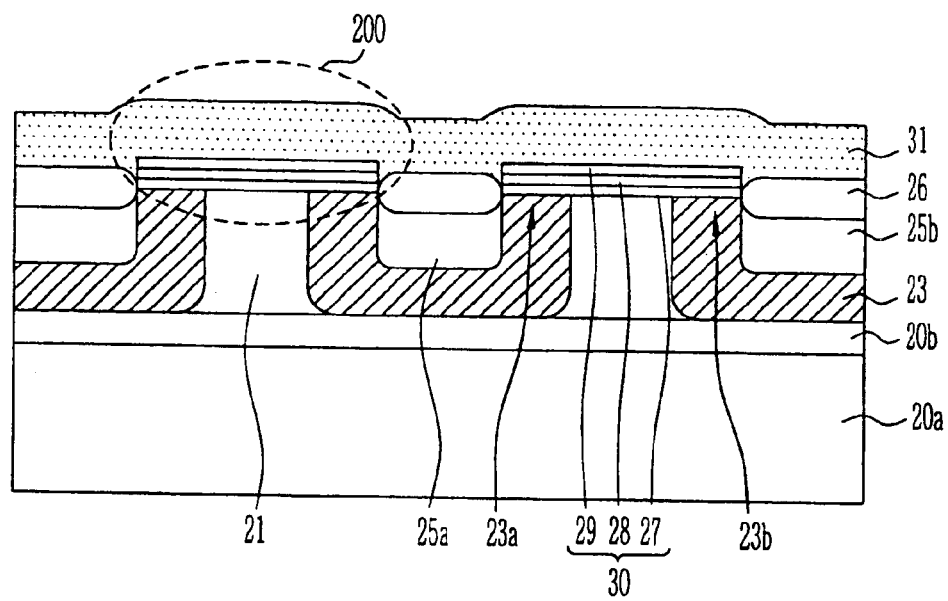
FIG. 3 is a cross-sectional view of the flash memory cell taken along lines X-X' in FIG. 2.

FIG. 2 is a layout diagram of a flash memory cell according to the present invention and FIG. 3 is a cross-sectional view of the flash memory cell taken along lines X–X' in FIG. 2.

Referring now to FIGS. 2 and 3, a flash memory cell 200 according to the present invention includes an ONO film 30 formed on a given region of a SOI semiconductor substrate 20, first and second channel regions 23a, 23b formed over the SOI substrate 20 at both edges of the ONO film 30, a source region 21 formed between the first and second channel regions 23a, 23b, first and second drain regions 25a, 25b formed over the SOI substrate 20 at both sides of the ONO film 30, and a word line 31 formed on the ONO film 30.

The ONO film 30 has a structure in which a lower oxide film 27, a nitride film 28 and an upper oxide film 29 are sequentially stacked. At this time, the lower oxide film 27 serves as a tunnel oxide film, the nitride film 28 serves as a floating gate, and the upper oxide film 29 serves as an insulating film for preventing electrons injected into the nitride film 28 from flowing toward the word line 31.

The first and second channel regions 23a, 23b consist of a P type impurity region 23. The first and second drain regions 25a, 25b consist of an N type purity region. At this time, the first and second drain regions 25a, 25b are formed in the P type impurity region 23 forming the first channel region 23a and the P type impurity region 23 forming the second channel region 23b. The source region 21 is isolated by an insulating layer 20b included in the SOI substrate 20 and the P type impurity region 23 at its both sides. The source region 21 is thus electrically separated from another source region. A device isolation film 26 is formed on the first and second drain regions 25a and 25b, so that the ONO film 30 is electrically separated.

A source contact plug 33a is formed in the source region 21 of the flash memory cell 200 constructed above. A drain contact plug 33b is formed in the drain regions 25a and 25b. The source contact plug 33a and the drain contact plug 33b are formed one by one every 5 through 10 cells 200. The number of the plugs may be varied depending on a design rule or a voltage to be applied.

A method of manufacturing the flash memory cell constructed above will be below described.

FIG. 4A through FIG. 4E are layout diagrams of the flash memory cells for describing a method of manufacturing the flash memory cell and FIG. 5A through FIG. 5E are cross-sectional views of flash memory cells for describing a method of manufacturing the flash memory cell according to the present invention.

Figure 4A:
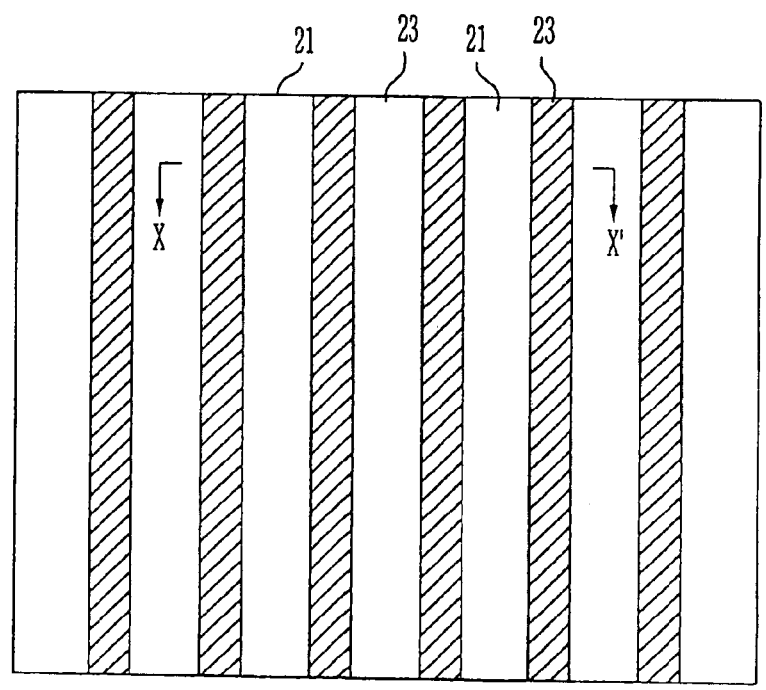
FIG. 4A through FIG. 4E are layout diagrams of the flash memory cells for describing a method of manufacturing the flash memory cell.
Figure 5A:
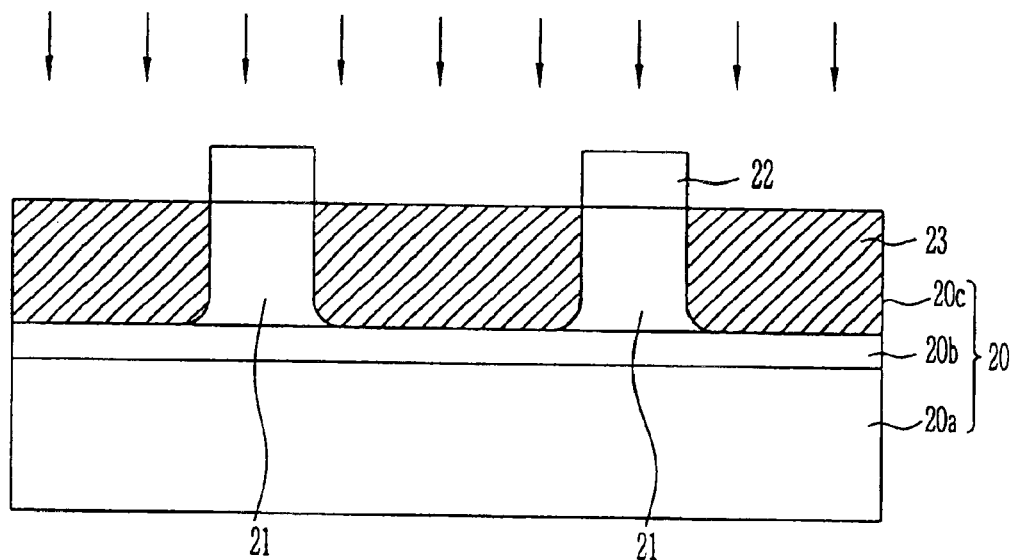
FIG. 5A through FIG. 5E are cross-sectional views of flash memory cells for describing a method of manufacturing the flash memory cell according to the present invention.

Referring now to FIG. 4A and FIG. 5A, a first photoresist pattern 22 is formed on the SOI substrate 20 in which the insulating layer 20b of a given depth is formed. A first ion implantation process is then performed to form a P type impurity region 23. At this time, the depth of the P type impurity region 23 is limited to a depth in which the insulating layer 20b is formed.

The SOI substrate 20 has a stack structure in which a silicon substrate 20a, an insulating layer 20b and a silicon layer 20c doped N type impurities are sequentially formed. The silicon layer 20c of the SOI substrate 20, for which the first ion implantation process is not performed, is defined by the source region 21. The P type impurity region 23 is formed in a Y-axis direction and the source region 21 is also formed in a Y-axis direction and forms a common source. The silicon layer 20c is formed using N type impurities. The source region 21 also becomes an N type. Therefore, it is not required to perform an impurity ion implantation process in order to define the source region 21. In case that the concentration of an impurity of the source region 21 is to be increased, additional ion implantation process is performed for the source region 21.

Figure 5B:
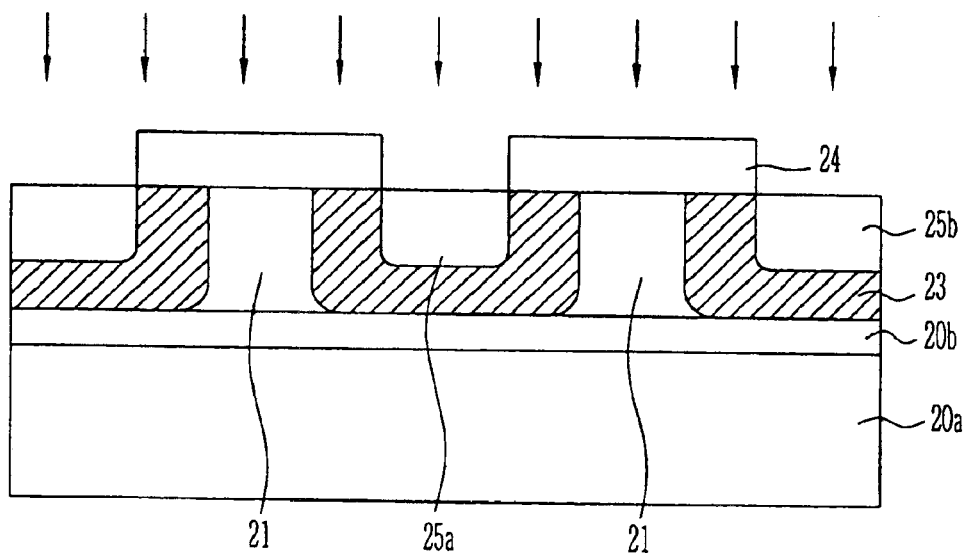

Referring now to FIG. 4A and FIG. 5B, the first photoresist pattern 22 is removed. A second photoresist pattern 24 by which a central region of the P type impurity region 23 is exposed is then formed. Drain regions 25a, 25b consisting of an N type impurity region are formed at the central region of the P type impurity region 23 through a second impurity ion implantation process. Two N type impurity regions constitute a pair to become first and second drain regions 25a, 25b for a single flash memory cell. At this time, the first and second drain regions 25a, 25b are formed at a high concentration compared to the P type impurity region 23. The first and second drain regions 25a, 25b are formed in a Y-axis direction to form a common drain.

As the first and second drain regions 25a, 25b are formed at the central region of the P type impurity region 23, an edge portion of the P type impurity region 23, in which the first and second drain regions 25a, 25b are not formed, is defined by the first and second channel regions 23a, 23b.

Figure 4B:
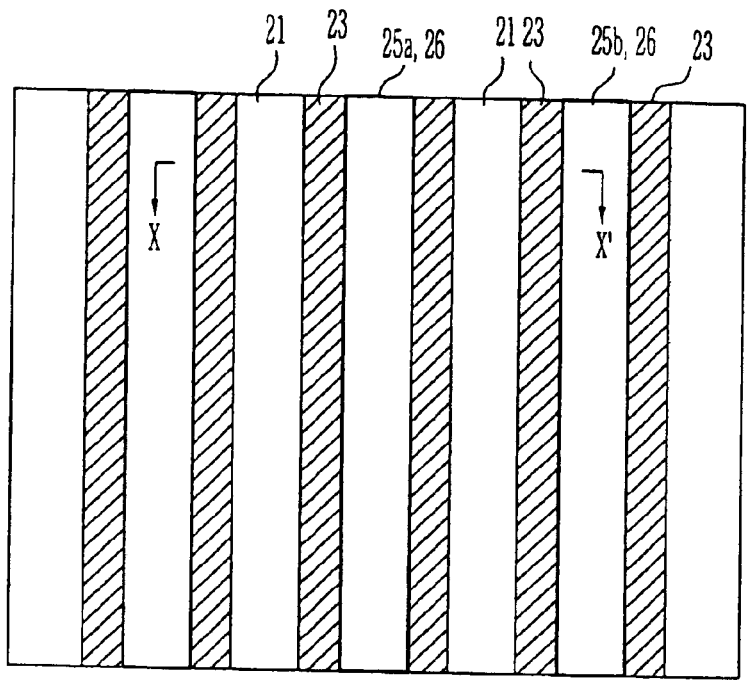
Figure 5C:
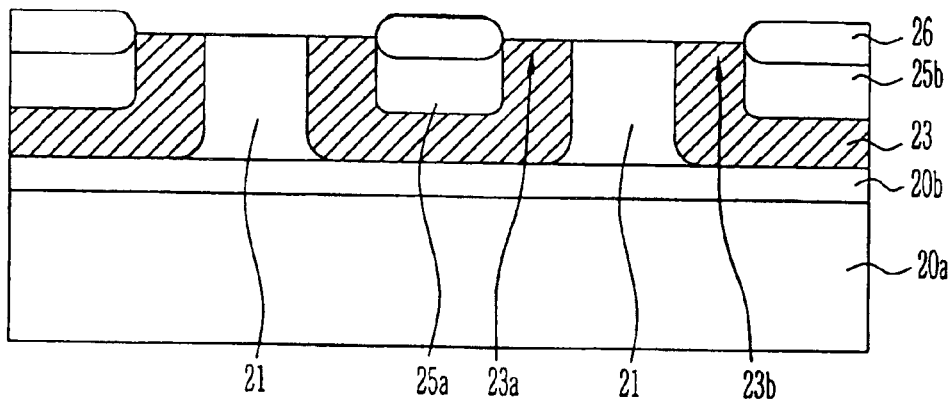

Referring now to FIG. 4B and FIG. 5C, after the second photoresist pattern 24 is removed, a device isolation film 26 is formed at the drain regions 25a, 25b. At this time, the device isolation film 26 consists of an oxide film by means of a thermal oxidation process. The device isolation film 26 formed by the thermal oxidation process is rapidly grown at the drain regions 25a, 25b that have a relatively higher concentration of an impurity than other regions. Therefore, the oxide film formed at other regions except for the drain regions 25a, 25b can be easily removed through a cleaning process.

Figure 4C:
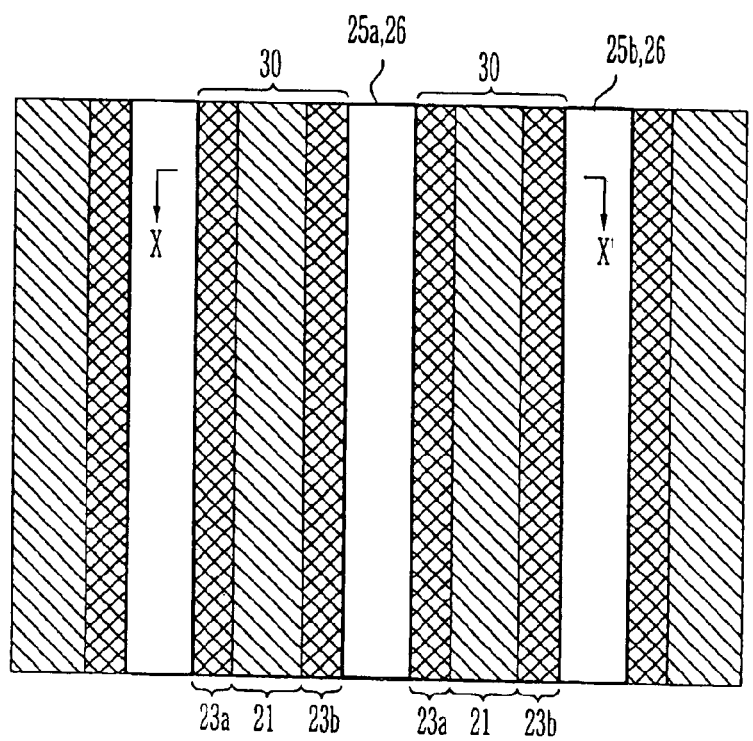
Figure 5D:
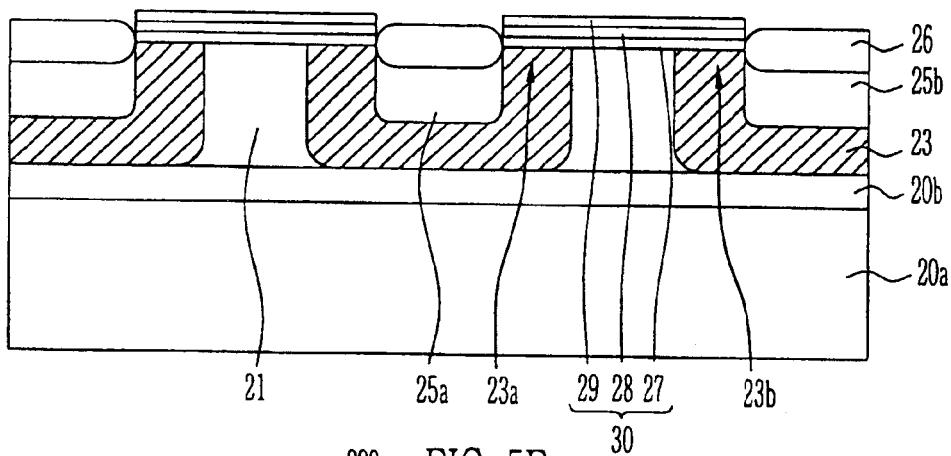

By reference to FIG. 4C and FIG. 5D, a lower oxide film 27, a nitride film 28 and an upper oxide film 29 are sequentially formed on the entire structure. The upper oxide film 29, the nitride film 28 and the lower oxide film 27 on the device isolation film 26 are then removed through a patterning process. The upper oxide film 29, the nitride film 28 and the lower oxide film 27 remain only on the source region 21 and the first and second channel region 23a, 23b of the P type impurity region 23. Thus, an ONO film 30 consisting of the upper oxide film 29, the nitride film 28 and the lower oxide film 27 is formed. At this time, the lower oxide film 27 serves as a tunnel oxide film, the nitride film 28 serves as a floating gate, and the upper oxide film 29 serves as an insulating film for preventing electrons injected into the nitride film 28 from flowing toward a word line to be formed in a subsequent process. At this time, both ends of the ONO film 30 are overlapped with the first and second channel regions 23a, 23b, respectively. Due to this, different data can be stored at both ends of the nitride film 28 through the first and second channel regions 23a and 23b. It is thus possible to store data of two bits at a single cell.

Meanwhile, in the process of forming the lower oxide film 27 in the ONO film 30, the device isolation film 26 and the lower oxide film 27 may be simultaneously formed. In other words, in FIG. 5C, the lower oxide film 27 may be directly formed without forming the device isolation film 26. Similarly, the lower oxide film 27 is rapidly grown in the drain regions 25a and 25b having a relatively higher impurity concentration than other regions. Therefore, the lower oxide film 27 is thickly formed in the drain regions 25a and 25b. Using this phenomenon, the device isolation film 26 can be also formed using the process for forming the lower oxide film 27.

Figure 4D:
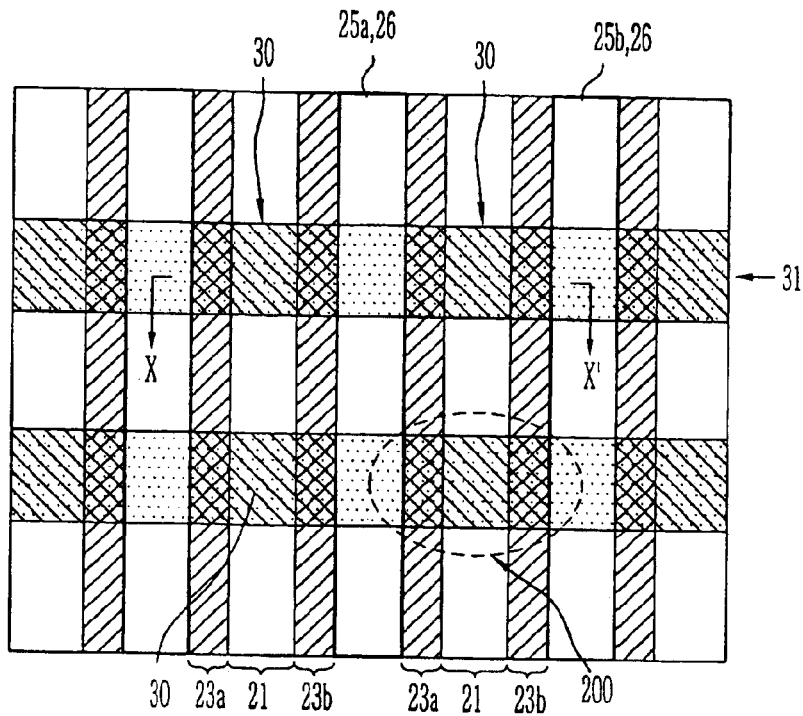
Figure 5E:
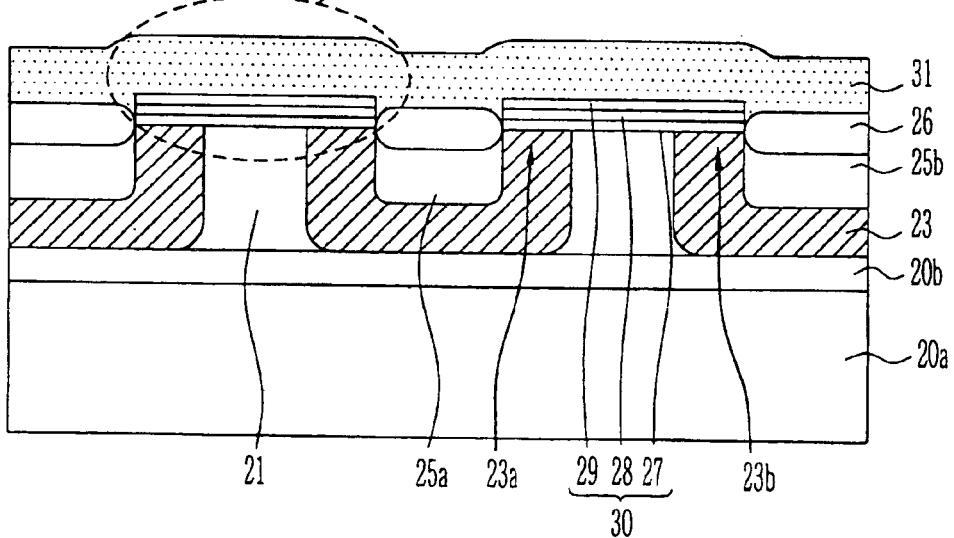

Referring now to FIG. 4D and FIG. 5E, a conductive material layer is formed on the entire structure. A word line 31 formed of the conductive material layer is then formed by a patterning process. The conductive material layer consists of a polysilicon layer. Thus, the flash memory cell 200 having a gate of a SONOS structure in which the ONO film 30 and the polysilicon layer are stacked is formed on the SOI substrate 20.

In the flash memory cell 200, the nitride film 28 in the ONO film 30 serves as a floating gate. Both ends of the ONO film 30 are overlapped with the first and second channel regions 23a, 23b consisting of the P type impurity region 23. Data is independently stored at the ONO film 30 by injecting electrons at both ends of the nitride film 28 through the first and second channel regions 23a, 23b or discharging the electrons. It is thus possible to store data of two bits at a single flash memory cell 200.

Next, a plug is formed in the source region 21 and the first and second drain regions 25a, 25b, respectively.

Figure 4E:
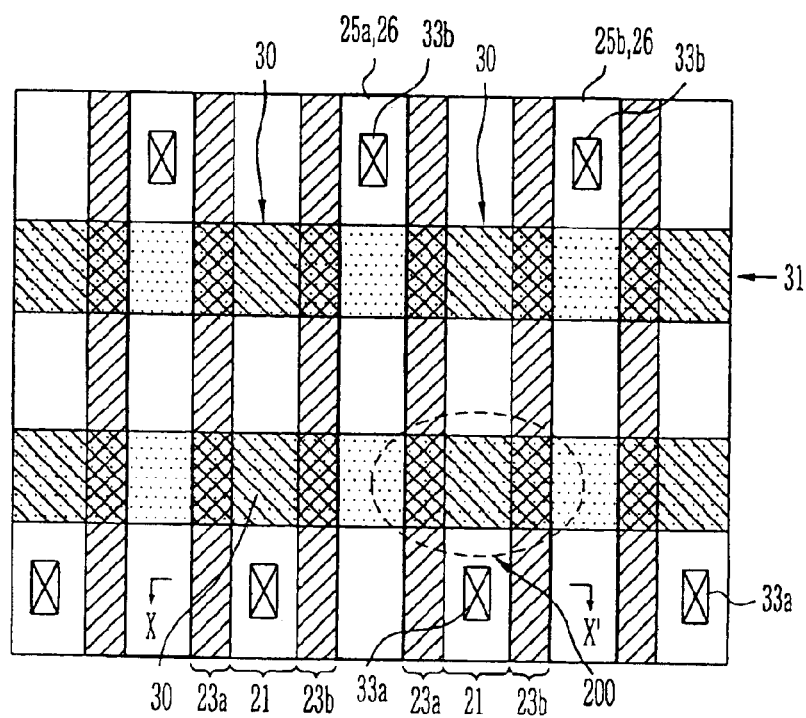
Figure 6A:
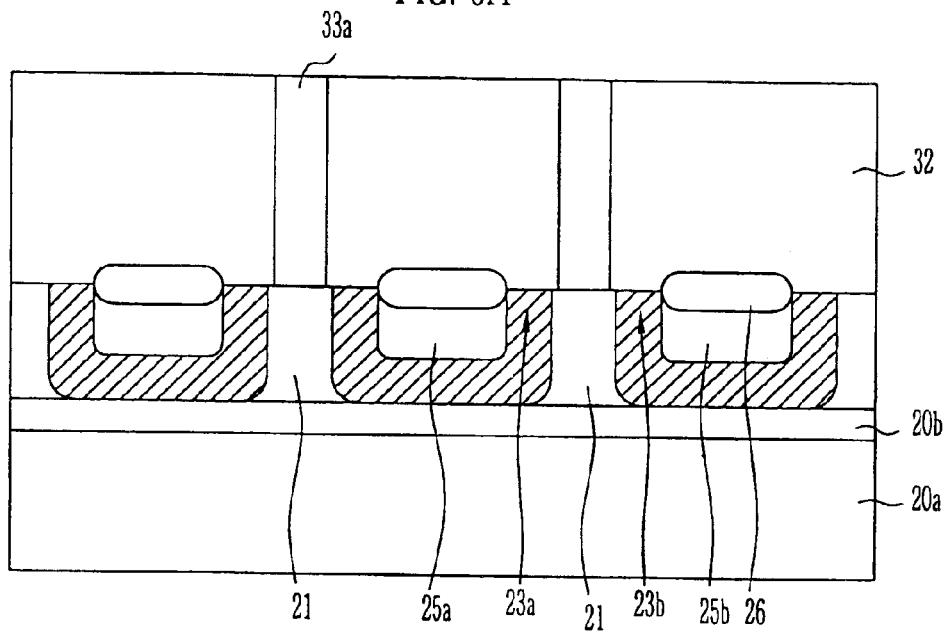
FIG. 6A and FIG. 6B are cross-sectional views of regions in which a source contact plug and a drain contact plug are formed, that are taken along an X-axis direction in the flash memory cell shown in FIG. 4E.
Figure 6B:
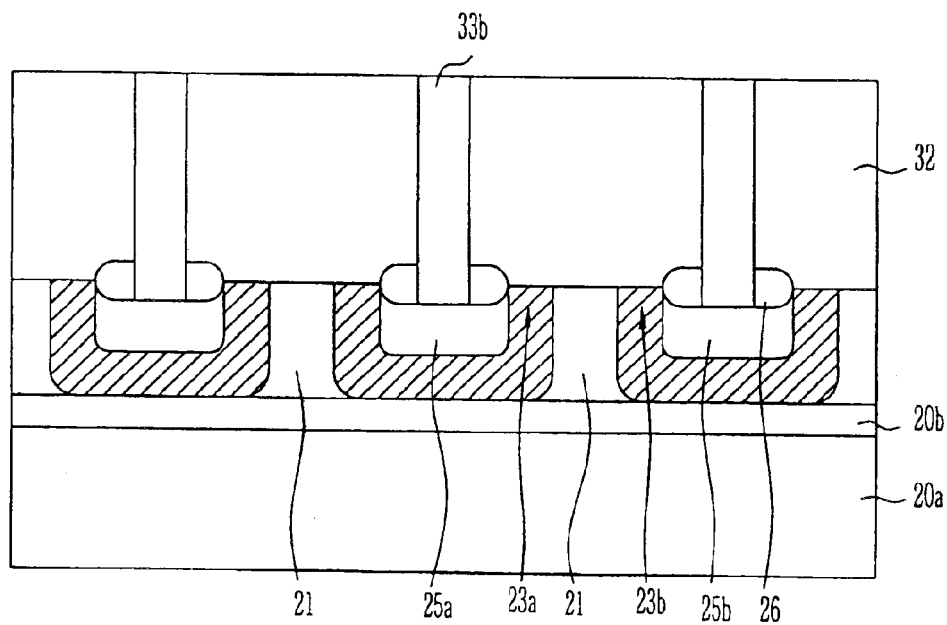

FIG. 6A is a cross-sectional view of a region in which a source plug will be formed, taken in a X-axis direction in FIG. 4E and FIG. 6B a cross-sectional view of a region in which a drain plug will be formed, taken in a X-axis direction in FIG. 4E Referring now to FIG. 4E, FIG. 6A and FIG. 6B, an interlayer insulating film 32 is formed on the entire structure. The interlayer insulating film 32 on the source region 21, and the device isolation film 26 and the interlayer insulating film 32 on the drain regions 25a and 25b are then etched to form a contact hole. Next, a conductive material is buried in the contact hole to form a source contact plug 33a and a drain contact plug 33b. At this time, the source contact plug 33a and the drain contact plug 33b are formed in 5 through 10 cells 200 one by one. The number of the plug may be varied depending on a design rule or a voltage to be applied.

With the above process, the flash memory cell 200 having the ONO film 30, the first and second channel regions 23a, 23b, the source region 21, the first and second drain regions 25a, 25b, and the word line 31 is manufactured.

A method of programming the flash memory cell constructed above will be below described.

FIG. 7A through FIG. 7D are cross-sectional views of the flash memory cells for describing a method of programming the flash memory cell shown in FIG. 3.

Referring now to FIG. 7A, with the flash memory cell according to the present invention, it is possible to independently store data by injecting electrons into one end of the nitride film 28 other than the nitride film 28 through the first channel region 23a.

An operation of injecting the electrons into one end of the floating gate consisting of the nitride film 28 through the first channel region 23a will be below described by reference to FIG. 7A and FIG. 7B.

Referring to FIG. 7A, in order to program the flash memory cell, the word line 31 is applied with a program voltage of 9V through 12V and the first drain region 25a is applied with a voltage of about 5V. The source region 21 is connected to a ground terminal GND. Also, in order to prevent injection of electrons into the other end of the nitride film 28 through the second channel region 23b, the second drain region 25b is also connected to the ground terminal GND. At this time, all the regions around the flash memory cell are floated, thus preventing a programming operation.

If the voltage is applied with the above conditions, hot carriers are generated from the first channel region 23a. The hot carriers are then trapped to one end of the nitride film 28 through the lower oxide film 27 of the ONO film 30 by means of the voltage applied to the word line 31. Thereby, the programming operation for one end of the floating gate consisting of the nitride film 28 is finished.

Another embodiment of a programming operation for injecting electrons into one end of the floating gate consisting of the nitride film 28 through the first channel region 23a will be described.

Referring to FIG. 7B, in order to program the flash memory cell, the word line 31 is applied with a program voltage of 9V through 12V and the source region 21 is applied with a voltage of about 5V. At this time, the first drain region 25a is connected to the ground terminal GND. Also, in order to prevent injection of electrons into the other end of the nitride film 28 through the second channel region 23b, the second drain region 25b is floated. At this time, all the regions around the flash memory cell are floated, thus preventing a programming operation.

If the voltage is applied with the above conditions, the hot carriers are generated from the first channel region 23a. The hot carriers are then trapped to one end of the nitride film 28 through the lower oxide film 27 of the ONO film 30 by means of the voltage applied to the word line 31. Thereby, the programming operation for one end of the floating gate consisting of the nitride film 28 is finished.

Figure 7C:
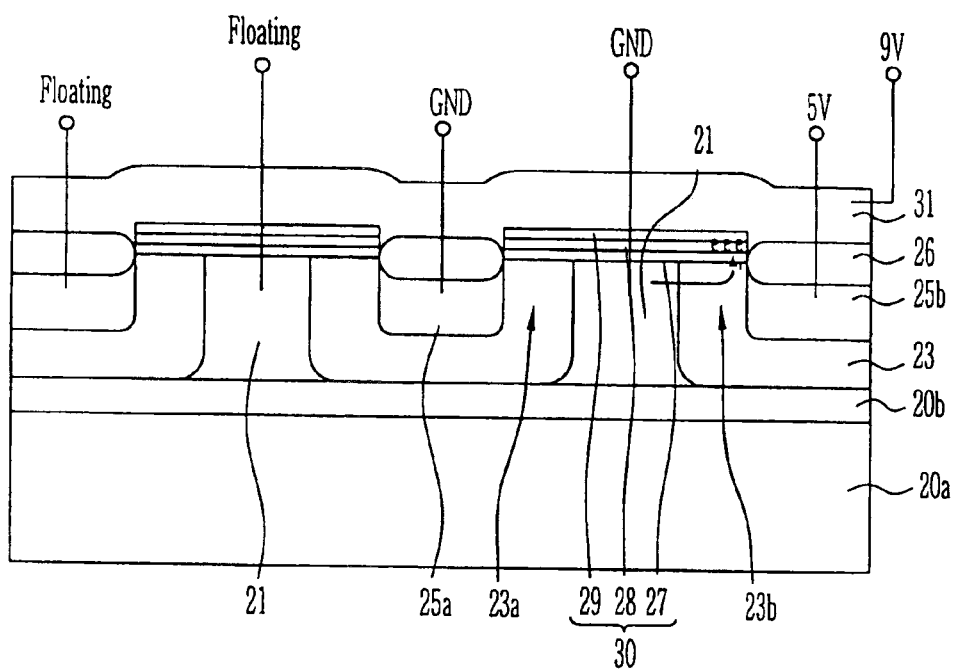

Referring now to FIG. 7C, with the flash memory cell according to the present invention, it is possible to independently store data by injecting the electrons in to the other end of the nitride film 28 other than the nitride film 28 through the second channel region 23b.

An operation of injecting the electrons into the other end of the floating gate consisting of the nitride film 28 through the second channel region 23a will be below described.

In order to program the flash memory cell, the word line 31 is applied with a program voltage of 9V through 12V and the second drain region 25b is applied with a voltage of about 5V. At this time, the source region 21 is connected to the ground terminal GND. Also, in order to prevent injection of electrons into one end of the nitride film 28 through the first channel region 23a, the first drain region 25a is connected to the ground terminal GND. At this time, all the regions around the flash memory cell are floated, thus preventing a programming operation.

If the voltage is applied with the above conditions, the hot carriers are generated from the second channel region 23b. The hot carriers are then trapped to the other end of the nitride film 28 through the lower oxide film 27 of the ONO film 30 by means of the voltage applied to the word line 31. Thereby, the programming operation for the other end of the floating gate consisting of the nitride film 28 is finished.

Figure 7D:
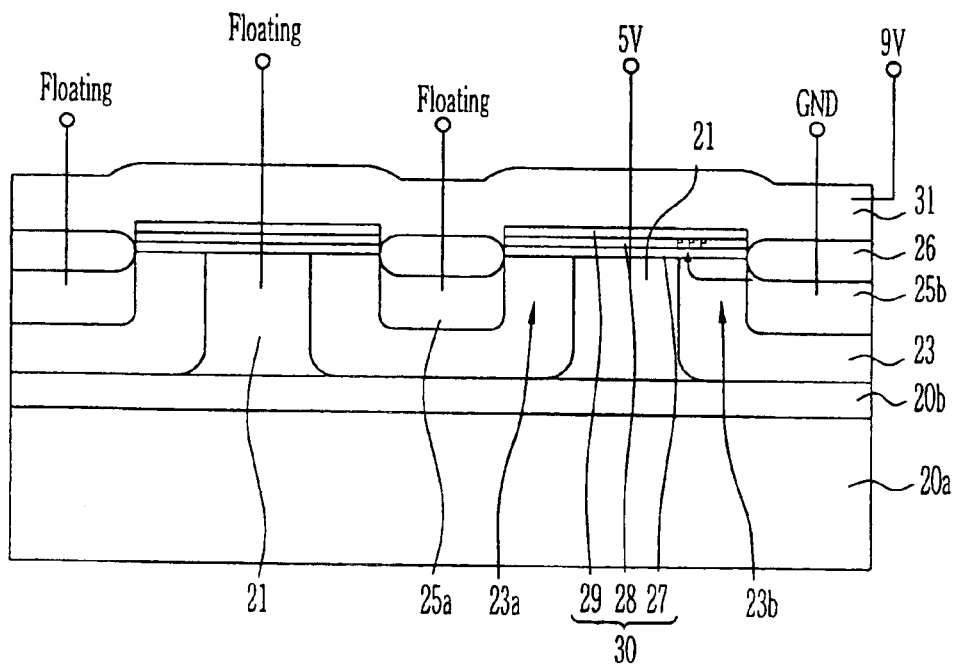

Another embodiment of a programming operation for injecting electrons into one end of the floating gate consisting of the nitride film 28 through the second channel region 23b will be described by reference to FIG. 7D.

In order to program the flash memory cell, the word line 31 is applied with a program voltage of 9V through 12V and the source region 21 is applied with a voltage of about 5V. At this time, the second drain region 25b is connected to the ground terminal GND. Also, in order to prevent injection of electrons into one end of the nitride film 28 through the first channel region 23a, the first drain region 25a is floated. At this time, all the regions around the flash memory cell are floated, the preventing a programming operation.

If the voltage is applied with the above conditions, the hot carriers are generated from the second channel region 23b. The hot carriers then are trapped to the other end of the nitride film 28 through the lower oxide film 27 of the ONO film 30 by means of the voltage applied to the word line 31. Thereby, the programming operation for the other end of the floating gate consisting of the nitride film 28 is finished.

A method of erasing the flash memory cell will be below described.

FIG. 8 is a cross-sectional view of the flash memory cell for describing a method of erasing the flash memory cell shown in FIG. 3.

As shown in FIG. 8, in order discharge the electrons injected into the floating gate consisting of the nitride film 28 by means of a programming operation, the word line 31 is applied with an erase voltage of about negative 10V and the first and second drain regions 25a, 25b are applied with a voltage of about 5V, in a state that the source region 21 floated. At this time, all the regions around the flash memory cell are floated, thus preventing erasing operation.

If the voltage is applied with the above conditions, electrons injected into one end and the other end of the nitride film 28 are discharged through the first and second channel regions 23a and 23b. Thereby, the erasing operation for one end and the other end of the floating gate consisting of the nitride film 28 is finished.

A method of reading data stored at the flash memory cell will be below described.

FIG. 9 is a cross-sectional view of the flash memory cell for describing a method of reading data stored at the flash memory cell.

As shown in FIG. 9, in order to read data stored at the flash memory cell, the word line 31 is applied with a read voltage of about 4V and the source region 21 is applied with a voltage of 0 through 0.8V. A current mirror (not shown) is connected to the first and second drain regions 25a and 25b, respectively. If the read voltage is applied to the word line 31, channels are formed in the first and second channel regions 23a and 23b. Thus, first and second cell currents $I_{C1}$ and $I_{C2}$ flow into the first and second channel region 23a and 23b. Through the first and second cell currents $I_{C1}$ and $I_{C2}$, a program state at one end and the other end of the nitride film 28 is detected. Data of two bits stored at the flash memory cell is thus read.

In the above, though data of two bits are stored depending on electrons injected into both ends of the nitride film 28, respectively, it is possible to store data of two bits at one end and the other end of the nitride film 28, respectively, by controlling a program operation condition for injecting the electrons every end. It is thus possible store data of four bits in a single cell.

A method of storing data of four bits at a single cell and reading them will be below described.

Though the electrons are injected into one end of the nitride film 28 using the programming method described by reference to FIG. 7A and FIG. 7B, a location of one end of the nitride film 28 into which the electrons are injected may be varied depending on the programming method described in FIG. 7A and the programming method described in FIG. 7B. In other words, if the electrons are injected based on the method described in FIG. 7A, the electrons are injected into a left side of one end of the nitride film 28. On the other hand, if the electrons are injected based on the method described FIG. 7B, the electrons are injected to a right side of one end of the nitride film 28. This true applies when the electrons are injected into the other end of the nitride film 28 using the programming method described in FIG. 7C and FIG. 7D.

More particularly, if a state that no electrons are not injected into one end of the nitride film 28 because the programming operation is not performed is defined as '11', a state that the electrons are injected into only a left side of one end of the nitride film 28 by the programming operation described in FIG. 7A is defined as '10', a state that the electrons are injected into only a right side of one end of the nitride film 28 by the programming operation described in FIG. 7B is defined as '01' and a state that the electrons are injected into both the left and right sides of one end of the nitride film 28 by the programming operations described in FIG. 7A and FIG. 7B is defined as '00', it is possible to store data of two bits only at one end of the nitride film 28. Similarly, if the above method is applied to the other end of the nitride film 28, it is possible to store data of four bits at a single flash memory cell using both ends of the nitride film 28.

A method of reading data by sensing the four states defined by the programming methods described in the above will be below described.

Figure 10A:
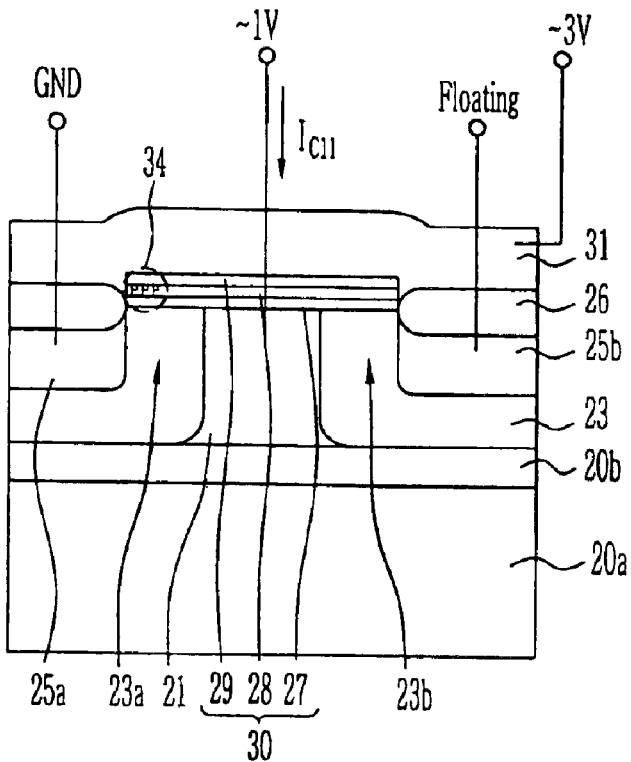
FIG. 10A and FIG. 10B are cross-sectional views of flash memory cells for describing a method of reading the flash memory cell according to the present invention.
Figure 10B:
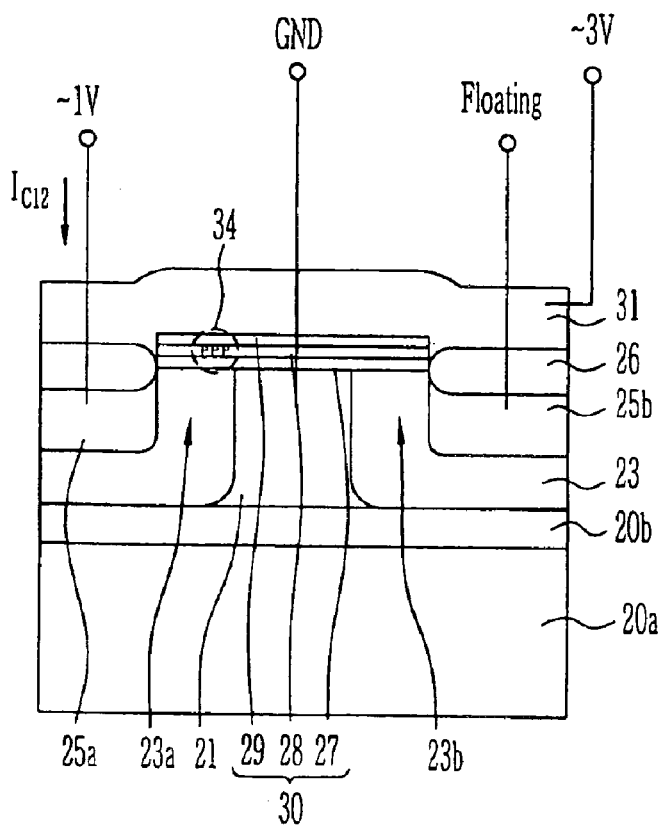

FIG. 10A and FIG. 10B are cross-sectional views of flash memory cells for describing a method of reading the flash memory cell according to the present invention.

A method of measuring a cell current and reading data depending on a state of the electrons injected into one end of the nitride film will be described by reference to FIG. 10A and FIG. 10B.

A first cell current $I_{C11}$ measured at the source region 21 and a second cell current $I_{C12}$ measured at the first drain region 25a may be varied depending on a location of the electrons injected into one end of the nitride film 28 and a voltage applied to the first drain region 25a and the source region 21.

As shown in FIG. 10A, in a state that the first drain region 25a is connected to the ground terminal GND, the first cell current $I_{C11}$ flowing into the source region 21 is sensed by applying a voltage of about 3V to the word line 31 and a voltage of about 1V to the source region 21. At this time, in order to prevent an error due to current flowing into the second drain region 25b in the process of sensing the first cell current $I_{C11}$, the second drain region 25b is floated.

Next, as shown FIG. 10B, in a state that the source region 25a is connected to the ground terminal GND, the second cell current $I_{C12}$ flowing into the first drain 25a is sensed by applying a voltage of about 3V to the word line 31 and applying a voltage of about 1V to the first drain region 25a. Similarly, in order to prevent an error due to current flowing into the second drain region 25b in the process of sensing the second cell current $I_{C12}$, the second drain region 25b is floated.

With the above read condition, if both the first and second currents $I_{C11}$ and $I_{C12}$ are sensed to have a given value, it means that no electrons are injected into only one end of the nitride film 28 because the programming operation is not performed. Thus, the stored data correspond to the state '11'.

On the other hand, if the first current $I_{C11}$ is sensed to have a given value and the second current $I_{C12}$ is sensed to have 0 A, it means that electrons are injected into the left side of one end of the nitride film 28 by the programming method shown in FIG. 7A. Thus, the stored data correspond to '10'.

Further, it the first current $I_{C11}$ is sensed to have 0V and the second current $I_{C12}$ is sensed to have a given value, it means that electrons are injected into only the right side of one end of the nitride film 28 by the programming method shown in FIG. 7B. Thus, the stored data correspond to '01'.

If both the first and second currents $I_{C11}$ and $I_{C12}$ are sensed to have 0 A, it means that electrons are injected into both sides of one end of the nitride film 28 by both the programming methods shown in FIG. 7A and FIG. 7B. Thus, the stored data correspond to '00'.

As such, it is possible to store data of two bits at one end of the nitride film and to read the stored data, by injecting electrons into one end of the nitride film depending on the programming methods shown in FIG. 7A and FIG. 7B and then sensing the first and second cell currents depending on the reading method shown in FIG. 10A and FIG. 10B.

Similarly, if the method is applied to the other end of the nitride film, it is possible to store data of two bits at the other end of the nitride film and to read the stored data. It is thus possible to store data of four bits at a single memory cell.

As mentioned above, according to the present invention, data of two or more bits can be stably stored at a single cell. Therefore, the present invention has an outstanding effect that it can improve the integration level of a device.

Further, a source region and a drain region are first formed and the tunnel oxide film is the formed. It is thus possible to prevent damage of a tunnel oxide film due to an ion implantation process. As a result, the present invention can an electrical characteristic of a device.

In addition, the flash memory cell is formed to have a SONOS structure. Therefore, the steps of a process can be reduced to improve reliability of the process.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory cell, comprising:
a tunnel oxide film formed at a given region of a SOI substrate;
a floating gate on the tunnel oxide film;
a dielectric film on the floating gate;
first and second channel regions at the SOI substrate below both ends of the floating gate;
a source region formed between the first and second channel regions;
first and second drain regions formed at the SOI substrate at both sides of the floating gate; and
a word line formed on the dielectric film,
wherein data of two bits or four bits are stored at a single cell by individually injecting electrons into the floating gate on the first and second channel regions or discharging the injected electrons, depending on voltages applied to the source region, the word line, and the first and second drain regions.

2. The flash memory cell as claimed in claim 1, wherein said floating gate is consisting of a nitride film.

3. The flash memory cell as claimed in claim 1, wherein the first and second channel regions each consist of a P type impurity region and wherein the first and second drain regions consist of a N type impurity region.

4. The flash memory cell as claimed in claim 3, wherein the first and second drain regions are formed in a P type impurity region forming the first channel region and a P type impurity region forming the second channel region, respectively.

5. The flash memory cell as claimed in claim 1, wherein a lower portion of the source region is precluded from an insulating film included in the SOI substrate, by which the source region is electrically isolated from other source regions.

6. The flash memory cell as claimed in claim 1, further comprising a device isolation film formed on the first and second drain regions, wherein the floating gate is separated by the device isolation film.

7. The flash memory cell as claimed in claim 1, further comprising a plurality of contact plugs formed to be respectively connected with the source region, and the first and second drain regions.

8. The flash memory cell as claimed in claim 7, wherein said contact plug is included one by one every 5 through 10 cells and the number of the contact plug is controlled by a design rule or a voltage to be applied.

* * * * *